(12) United States Patent
Kato

(10) Patent No.: US 7,132,791 B2
(45) Date of Patent: Nov. 7, 2006

(54) ELECTROLUMINESCENCE DISPLAY

(75) Inventor: Yoshifumi Kato, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 100 days.

(21) Appl. No.: 10/821,903

(22) Filed: Apr. 9, 2004

(65) Prior Publication Data
US 2004/0239240 A1 Dec. 2, 2004

(30) Foreign Application Priority Data
Apr. 11, 2003 (JP) ............................. 2003-107313

(51) Int. Cl.
*H05B 33/00* (2006.01)
(52) U.S. Cl. ...................... 313/506; 313/112; 313/113; 313/504
(58) Field of Classification Search ................ 313/498, 313/501, 504, 506, 509, 512, 112, 113
See application file for complete search history.

(56) References Cited

U.S. PATENT DOCUMENTS

| 5,072,152 | A * | 12/1991 | Tuenge et al. ............... 313/509 |
| 6,747,405 | B1 * | 6/2004 | Hosokawa .................. 313/504 |
| 6,831,407 | B1 * | 12/2004 | Cok ........................... 313/504 |
| 6,833,667 | B1 * | 12/2004 | Hamano et al. ............. 313/504 |
| 2004/0036410 | A1 * | 2/2004 | Park et al. ................... 313/504 |

FOREIGN PATENT DOCUMENTS

| JP | 09-127885 | 5/1997 |
| JP | 2000-040584 | 2/2000 |
| JP | 2002-207433 | 7/2002 |
| KR | 1997-003851 | 3/1997 |
| KR | 1999-060923 | 7/1999 |
| KR | 2003-013700 | 10/2000 |

* cited by examiner

*Primary Examiner*—Ashok Patel
(74) *Attorney, Agent, or Firm*—Morgan & Finnegan LLP

(57) ABSTRACT

An organic electroluminescence display. The display comprises a transparent electrode, a metal electrode and a organic thin layer which is disposed between the pair of electrodes and which includes a light emitting layer. The metal electrode has a reflection scattering property. Since the metal electrode has a reflection scattering property, the ambient light is reflected in various directions so that the reflected light returns and is incident on the color filter. In this way, within the incident light due to reflection scattering on any of the filter regions that has a different color from that of light already transmitted through the filter regions, light with different wavelength from that of the incident light is attenuated. Accordingly, the reflection of the ambient light is further attenuated.

10 Claims, 3 Drawing Sheets

1

ELECTROLUMINESCENCE DISPLAY

BACKGROUND OF THE INVENTION

The present invention relates to an electroluminescence (EL) display using a metal electrode having a reflection scattering property, in particular, for preventing a decrease in contrast due to reflection of ambient light.

Recently, development of illumination devices having electroluminescence elements (hereinafter referred to as "EL display") is in progress. As shown in FIG. 5, an EL display 51 comprises a transparent substrate 56 and an EL element 57. The EL element 57 is formed from a laminate structure in which a organic thin layer 53 is provided. The organic thin layer 53 which includes at least a light emitting layer provided with blue, green and red light emitting regions and which is sandwiched between a metal electrode 52 with a small work function and a transparent electrode 54. Electrons are injected into the organic thin layer 53 from one of the electrodes and holes are injected from the other electrode. Light is emitted when the electrons and holes recombine within the light emitting material layer. The emitted light is visible from the transparent substrate 56 side.

Luminance of the display is often enhanced by reflecting the light rays from the metal electrode 52 in the EL device 57, by using metals having high reflectivity, such as magnesium (Mg), magnesium-silver alloy (MgAg), magnesium-indium alloy (MgIn), aluminum (Al), lithium-aluminum alloy (LiAl), for the metal electrode 52. Accordingly, in the device structure described above, the metal electrodes 52 can function as a mirror with a high light reflecting property when the device is not generating light by electroluminescence, which can project the ambient environmental view, or can cause problems in the application of the display. The problems are for example a decrease in contrast due to reflection of ambient light, and failing to display the color of black.

In order to solve the above described requirements, Japanese Laid-Open Patent Publication 9-127885 discloses an organic electroluminescence device in which a ¼ wavelength plate and a linear polarizer are disposed in that order, on the transparent substrate side, which functions as the light emitting surface.

However in this organic EL device, the light emitted from the light emitting layer is also transmitted through the polarizer, so that the light attenuates during the transmission therethrough and decreases the amount of light emitted.

BRIEF SUMMARY OF THE INVENTION

The present invention has been made in view of the above described requirements and provides an electroluminescence display which can suppress a decrease in contrast due to reflection of ambient light and can have high luminance.

In order to achieve the above objects, an organic electroluminescence display is provided, comprising:
a transparent electrode;
a metal electrode; and
an organic thin layer which is disposed between the transparent electrode and the metal electrode, said organic thin layer including a light emitting layer,
wherein the metal electrode has a reflection scattering property.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Organic electroluminescence displays according to embodiments of the invention are described in detail below.

(First Embodiment)

Figure 1:
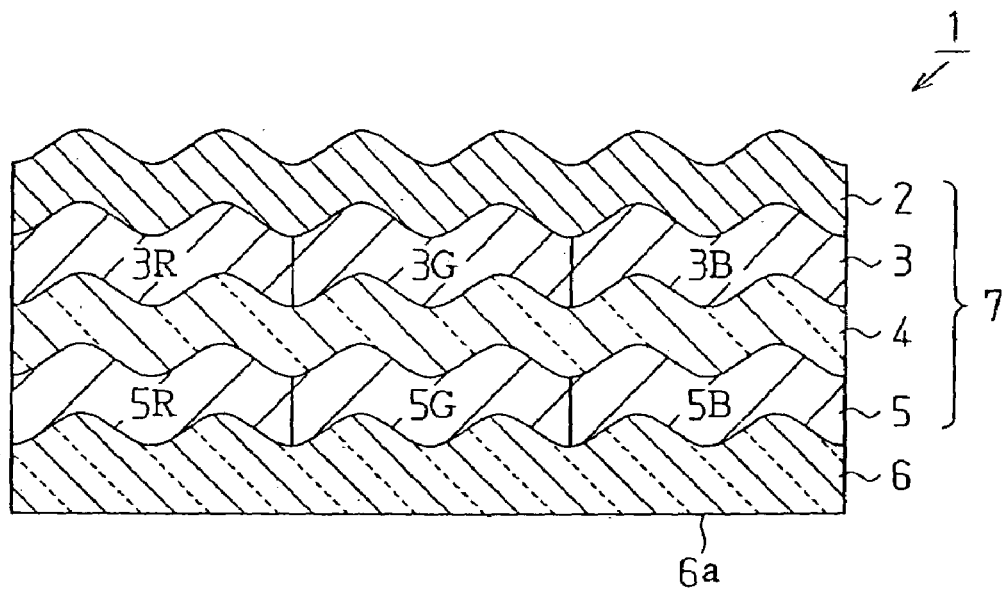
FIG. 1 is a schematic view showing a partial cross section of an organic electroluminescence display according to an embodiment of the invention.

An embodiment of the present invention is described below by referring to FIGS. 1 and 2.

An organic electroluminescence display 1 according to the first embodiment comprises a transparent substrate 6 and an organic electroluminescence element 7 disposed on the transparent substrate 6.

The transparent substrate 6, such as glass or resin, may be any substrate that can be used for bottom-emission type organic electroluminescence devices and transmits light of which at least a portion thereof is in the visible spectrum. A surface which opposes a light exit surface 6a of the transparent substrate 6 has a bumpy surface, formed with a plurality of irregular bumps and hollows. The shape can be formed through techniques such as annealing after selectively etching the surface by using photoresist, or by surface treatment using sandblasting. A metal electrode 2 is thereby provided with a reflection scattering property.

The organic electroluminescence element 7 comprises a transparent electrode 4, the metal electrode 2, an organic thin layer 3 sandwiched between the pair of electrodes, and a color filter 5 disposed on the transparent electrode 4 side of the lamination.

Any material that includes as the electrode material a metal, an alloy, an electric conductive compound and a mixture thereof having high work function (no less than 4 eV) can be preferably used for transparent electrode 4. Examples of the electrode materials are metals such as gold (Au), and transparent or semi-transparent materials having a dielectric property, such as a copper-iodine compound (CuI), indium-tin-oxide (ITO), tin oxide ($SnO_2$), zinc oxide (ZnO), etc. The electrode can be manufactured through forming a thin film through methods such as evaporation or sputtering of any of these electrode materials. The transmittivity is preferably greater than 10% when light is extracted from the electrode. The sheet resistivity of the electrode is preferably less than 1000 Ω/sheet. The thickness of the thin film depends on the material used, and can often be in a range between 5 nm and 1 μm, and preferably between 10 nm and 350 nm.

Any material that includes as the electrode material a metal, an alloy, an electric conductive compound and a mixture thereof having high work function (no less than 4 eV) can be preferably used for the metal electrode 2. Examples of the electrode materials are sodium, sodium-potassium alloy, magnesium, lithium, mixture of magnesium and copper, aluminum/aluminum oxide ($Al/Al_2O_2$), indium and rare earth metals. The metal electrode 2 can be manufactured by forming a thin film through methods such as evaporation or sputtering of any of the electrode materials. The sheet resistivity of the electrode is preferably less than 1000 Ω/sheet. The thickness of the thin film can often be in a range between 5 nm and 1 μm, and preferably between 10 nm and 350 nm.

The organic thin film 3 can be a single layer of a light emitting layer, or can be multiple layers in which at least one of a hole injection layer, a hole transport layer, a hole injection/transport layer, a hole blocking layer, an electron injection layer, an electron transport layer, an electron blocking layer and a light emitting layer are laminated.

The organic thin film layer 3 of the first embodiment is a laminate of a hole injection layer, a hole transport layer, a light emitting layer, an electron transport layer and an electron injection layer. The light emitting layer of the organic thin film 3 includes light emitting regions 3R, 3B and 3G which are formed from materials for emitting three different colored lights, red, green and blue, and which are disposed adjacent to each other in a plane. A set of the three light emitting regions 3R, 3B and 3G form a pixel as a whole.

For the materials for each light emitting region in the light emitting layer:

4-(di-cyano-methylene)-2-methyl-6-(p-dimethyl-amino-styryl)-4H-pyran (DCM) which has a structure shown by formula 1 and can be used in the red light emitting region 3R;

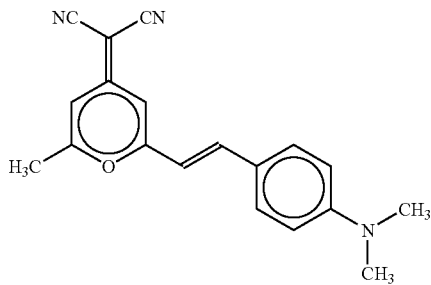

Formula 1

Aluminum quinoline (Alq) having a structure shown by formula 2 can be used in the green light emitting region 3G; and

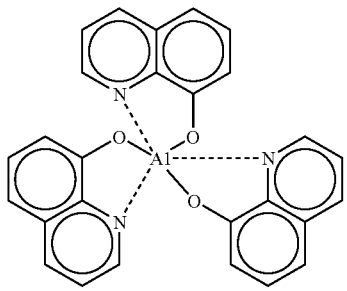

Formula 2

OMSB having a structure shown by formula 3 can be used in the blue light emitting region 3B.

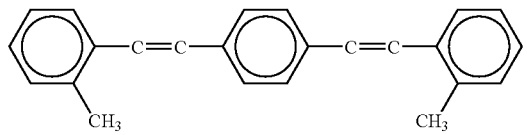

Formula 3

A color filter 5 is formed with a fine pattern of filter regions of red 5R, green 5G and blue 5B in a plane. In other words, a plurality of filter regions are disposed in a plane for respectively transmitting different colors of light. Note that the blue filter region 5B is not always necessary when an ultraviolet ray cut filter is disposed either on the inner side or outer side of the transparent substrate.

The color filter 5, the transparent electrode 4, the organic thin film layer 3 and the metal electrode 2 are laminated in that order over the transparent substrate 6. Each layer has approximately the same film thickness. While the total thickness of each layer of the color filter 5, the transparent electrode 4, the organic thin film layer 3 and the metal electrode 2 is between 0.3 μm and 1.0 μm in general, the average height of the bumped form is between 0.2 μm and 1.5 μm and the average pitch of the bump is approximately between 5 μm and 20 μm. In this way, the metal electrode 2 also has a bumpy surface to comply with the bumps on the surface of the transparent substrate opposing the light exit surface 6a.

The color filter 5 is formed on the transparent substrate, for example by photolithography. The transparent electrode 4, the organic thin film layer 3 and the metal electrode 2 are then deposited in that order. In other words, the color filter 5 is disposed between the transparent substrate 6 and the transparent electrode 4 in a gapless manner.

Note that the color filter 5 is formed with filter regions 5R, 5G and 5B with a pitch corresponding to that of the light emitting region 3R, 3G and 3B, so that filter regions 5R, 5G and 5B are disposed to respectively oppose each light emitting region 3R, 3G and 3B. The filter regions 5R, 5G and 5B have a property to transmit at least a portion of the light emitted from their opposing light emitting regions 3R, 3G and 3B. Specifically in the first embodiment the filter regions are selected to have the same or approximately the same color as the light emitted from each light emitting regions 3R, 3G and 3B. Note that the organic electroluminescence element 7 is coated with a protective film (for example a passivation film), though not shown in the figures.

Figure 2:
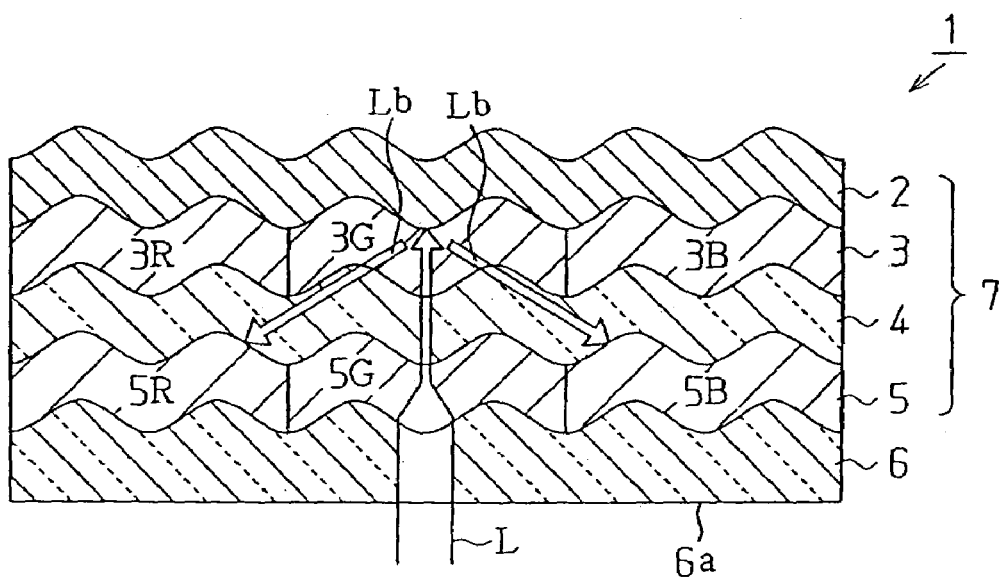
FIG. 2 shows the path of ambient light in the organic electroluminescence display of FIG. 1.

In FIG. 2, ambient light L which entered into the transparent substrate 6 is attenuated by approximately one third by transmission through the filter regions 5R, 5G and 5B of the color filter 5. Specifically, the color filter 5 is formed with fine patterns of the red filter region 5R, green filter region 5G and blue filter region 5B. The red filter region 5R transmits light having a wavelength of 600 nm or more but does not transmit light having shorter wavelength. The green filter region 5G transmits light with wavelengths around 500 nm but does not transmit light having wavelengths of 400 nm or less, and 600 nm or greater. The blue filter region 5B transmits light with wavelengths around 450 nm but does not transmit light having wavelengths of 350 nm or less and 550 nm or greater. Accordingly, when the ambient light L is transmitted through the color filter 5, the incident ambient light L is attenuated when the light rays do not correspond to the transmission properties of each filter region 5R, 5G and 5B of the color filter 5.

The attenuated ambient light L reaches the metal electrode 2 by way of the transparent electrode 4 and the organic thin film layer 3. Since the metal electrode 2 has a reflection scattering property, the ambient light L is reflected into various directions so that the reflected light Lb returns and is incident on the color filter. In this way, with the incident light on any of the filter regions 5R, 5G or 5B that are caused by reflection scattering and that have different color from the color of already transmitted through filter regions 5R, 5G or 5B, the light rays of wavelengths different from the wavelengths of the initial incident light are attenuated. Accordingly, the reflection $L_b$ of the ambient light L is further attenuated before extraction.

On the other hand, the light emitted from each light emitting region 3R, 3G and 3B is incident on the color filter 5 by way of the transparent electrode 4. The color filter 5 is formed with filter regions 5R, 5G and 5B with the pitch corresponding to each light emitting region 3R, 3G and 3B so that each filter region 5R, 5G and 5B is disposed to respectively oppose a light emitting region 3R, 3G and 3B. Further, a color transmission property of each filter region 5R, 5G, 5B is predetermined so that the each filter region 5R, 5G, 5B and the opposing each light emitting region 3R, 3G, 3B are respectively the same colors or substantially the same colors. Accordingly, while the light emitted from the light emitting regions 3R, 3G and 3B is extracted to the outside by passing through the filter regions 5R, 5G and 5B without being subjected to attenuation, undesirable light rays among the light emitted from the light emitting regions 3R, 3G and 3B and transmitted through the filter regions 5R, 5G and 5B of the same or substantially the same colors are attenuated to improve the color purity. Further, any light ray that is emitted and scattered from the light emitting regions 3R, 3G and 3B and is incident on the adjacent filter regions 5R, 5G and 5B having different color of the color filter 5 from the light emitting region is attenuated and scarcely extracted to the outside since the adjacent filter region has a different color transmission property.

For example, red light emitted from the light emitting region 3R is emitted, not only towards the front side but also to the sides, so that it enters into the adjacent green filter region 5G or blue filter region 5B. However, a substantial portion of the red light is attenuated in accordance with the color transmission property of the color filter 5 as it passes through the green filter region 5G or the blue filter region 5B, so that it is not emitted to the outside. Degradation of color purity is prevented in this way.

Further, by disposing the color filter 5 in a gapless manner between the color filter 5 and the transparent substrate 4, the distance between the light emitting regions 3R, 3G and 3B and the respective filter regions 5R, 5G and 5B can be made small to reduce generation of any light that enters into the adjacent different colored filter regions 5R, 5G and 5B to be subjected to attenuation. By this structure, the proportion of the light that is emitted from the light emitting regions 3R, 3G and 3B and that passes through the filter regions 5R, 5G and 5B of the same or substantially the same color can become extremely high. Accordingly, the loss of light during light emission is lowered.

In the first embodiment, the metal electrode 2 is formed with a bumpy surface, thereby providing a reflection scattering property. When the ambient light L reaches the metal electrode 2, the reflection of the ambient light L is scattered in various directions. Accordingly, the decrease in the contrast and reflection of the ambient environmental view can be prevented. Further, because a polarizer is not used, the light rays emitted from the light emitting regions 3R, 3G and 3B are not subjected to attenuation so that the organic electroluminescence display can be provided with high luminance.

The color filter 5 is disposed on the transparent electrode 4 of the display. The color filter is provided with a plurality of filter regions disposed in a plane to respectively transmit colored light that is different from the colored light transmitted through another filter region. Accordingly, ambient light L entering from the transparent substrate 6 is attenuated by approximately one third by transmission through the filter regions 5R, 5G and 5B of the color filter 5. Further, because the metal electrode 2 having a reflection scattering property is used, the light which is transmitted through each filter region 5R, 5G and 5B is reflected and scattered at the metal electrode 2 to enter into the color filter 5 again. At this time, light, which has entered into any of the filter regions 5R, 5G and 5B that are different in color from the already transmitted filter region 5R, 5G and 5B due to scattered reflection, is further attenuated because light having a different wavelength from those attenuated from the incident light, are attenuated again. The reflection of the ambient light is thus further suppressed so that a decrease in contrast and reflection of ambient environmental surroundings can be prevented.

While the light emitted from each light emitting region 3R, 3G and 3B is extracted to the outside through each filter region 5R, 5G and 5B, ambient light that has entered into the transparent substrate 6 is attenuated in accordance with the color transmission property of each filter region 5R, 5G and 5B when it passes through the color filter 5.

The light emitting layer can be formed with a plurality of light emitting regions 3R, 3G, and 3B disposed in a plane. Each of the light emitting regions 3R, 3G, and 3B emits light having a color that is different from that of another light emitting region. The color filter 5 is formed with a plurality of filter regions 5R, 5G, and 5B disposed in a plane, and each of the filter regions transmits light having a color that is different form that of another filter region. Each light emitting region 3R, 3G, and 3B is disposed to respectively oppose a corresponding filter region 5R, 5G, and 5B. Each filter region 5R, 5G, and 5B transmits at least a portion of the light emitted from its opposing light emitting region 3R, 3G, and 3B. Accordingly, the ambient light L which entered from the transparent substrate 4 is attenuated by passing through the filter regions 5R, 5G, and 5B.

Each color filter 5R, 5G, and 5B can also have a color transmission property to transmit the same or substantially the same color as its opposing light emitting region 3R, 3G, and 3B. Accordingly, the color purity is enhanced because most of the light rays emitted from the light emitting regions 3R, 3G, and 3B pass through the filter regions 5R, 5G, and 5B having the same or substantially the same color. Moreover, the loss of light during light emission is lowered.

A white colored light emitting region can also be disposed in a plane for the light emitting layer and a plurality of filter regions disposed in a plane to transmit light of respectively different colored light. Each light emitting region of the light emitting layer is disposed to respectively oppose each of the filter regions of the color filter.

In this case, not only prescribed light rays are extracted to the outside pursuant to the color transmission property of each filter region 5R, 5G, and 5B, ambient light entering from the transparent substrate 6 is attenuated during transmission through the color filter to follow the color transmission property of each filter region 5R, 5G, and 5B.

The color filter 5 and the organic thin film layer 3 are disposed by interposing the transparent electrode 4. In this way, the proportion of the light that is emitted from the light emitting regions 3R, 3G and 3B that pass through the filter regions 5R, 5G and 5B of the same or substantially the same color can become extremely high. Accordingly, the loss of light during light emission is lowered.

The organic thin film layer 3 has a bumpy surface. Accordingly, the luminance of the display is improved by increased surface area compared to an organic thin film layer formed into a flat shape having the same size.

(Second Embodiment)

Figure 3:
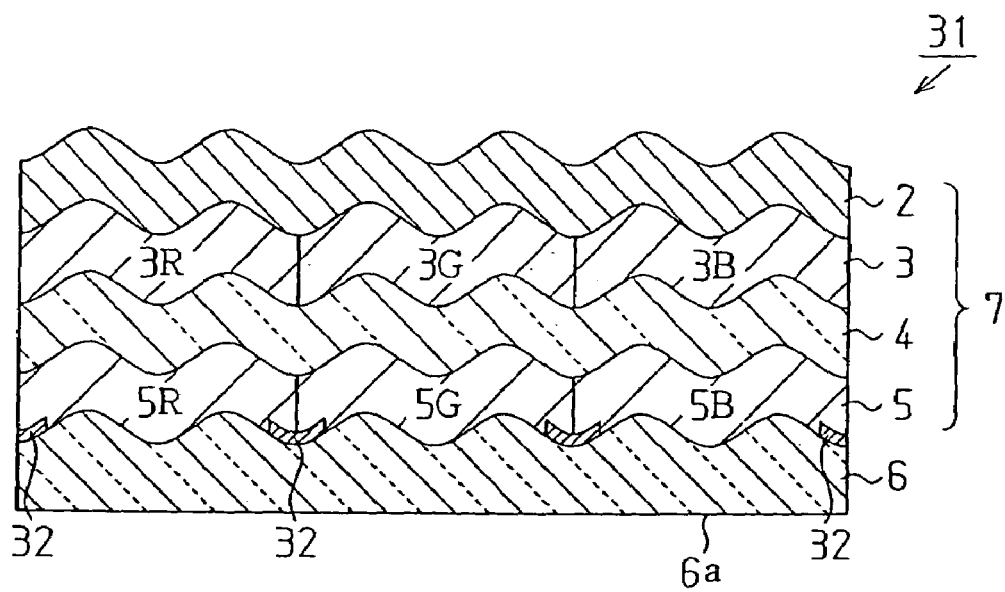
FIG. 3 is a schematic view showing a partial cross section of an organic electroluminescence display according to another embodiment of the invention.

The second embodiment differs from the first embodiment in that a black matrix 32 is disposed as shown in FIG. 3, to form a surrounding around each filter region 5R, 5G and 5B of the color filter 5.

While a chromium film (preferably a low reflection chromium film) is used in this embodiment for the black matrix 32, a color filter including black pigment can also be used.

The organic electroluminescence display 31 according to second embodiment is formed by disposing a black matrix of a prescribed pattern over the transparent substrate 6, and then by laminating the color filter 5, the transparent electrode 4, the organic thin film layer 3, the metal electrode 2 in that order similarly to the first embodiment.

According to the second embodiment, since light rays emitted from a filter region and light rays emitted from its adjacent different colored filter region are not assimilated, the color purity can be improved.

It should be apparent to those skilled in the art that the present invention may be embodied in many other specific forms without departing from the spirit or scope of the invention.

While the surface opposing the light exit surface of the transparent substrate is formed with a bumpy surface formed with a plurality of irregularly arranged recesses and bumps in the first embodiment, the recesses and the bumps can also be regularly arranged. However, the irregular arrangement is more preferable because the irregular bumps and hollows would form an irregular bumpy surface on the metal electrode to cause the reflected light to propagate in various directions to thereby enhance the reflection scattering effect to further attenuate the ambient light.

The recesses and bumps may be formed in only a portion of the surface of the transparent substrate instead of forming these on the entire surface. By doing so, the bumps and hollows are formed on a portion of the metal electrode to provide a reflection scattering effect. Further, only a bump and or a hollow may be formed instead of forming a plurality of these. Further, the reflection scattering effect can be obtained where only hollows are formed, or only bumps are formed.

While an organic electroluminescence device of the first embodiment comprises each of the color filter, the transparent electrode, the organic thin film layer, and the metal electrode that are formed above the bumpy surface of the transparent substrate, a reflection scattering effect can be obtained if only the metal electrode is provided with the bumpy surface.

While each of the color filter, the transparent electrode, the organic thin film layer and the metal electrode of the first embodiment is approximately uniform in layer thickness, some of the layers can have a structure in which a layer thickness at the hollow portion is formed with greater in comparison with a layer thickness at the bump portion or in which a layer thickness at the bump portion is formed with greater in comparison with a layer thickness at the hollow portion, instead of forming all of the layers with the same shape. In this way, each layer can have a different shape from each other to result in various refraction angles at the interfaces so that the reflection scattering effect can be improved.

Figure 4:
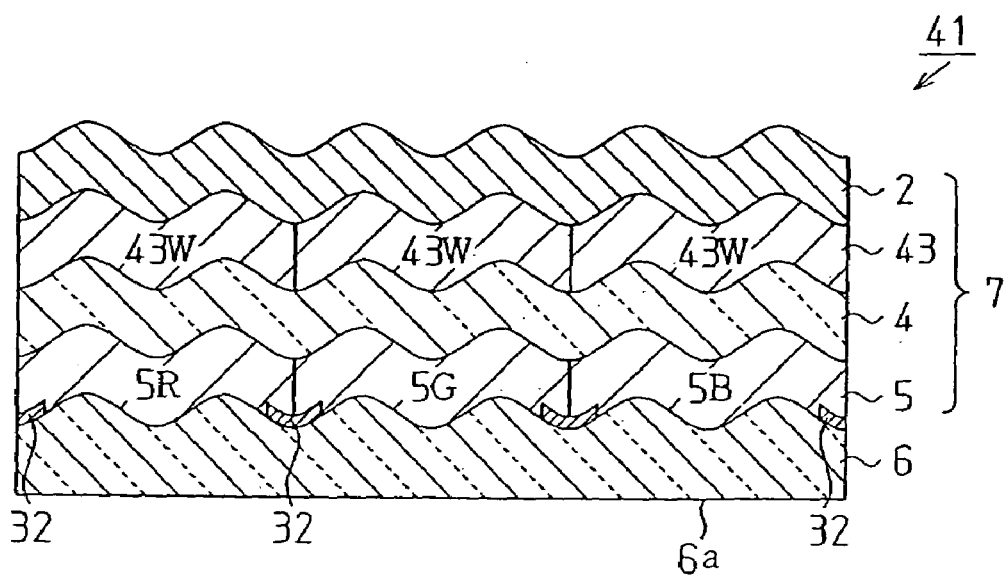
FIG. 4 is a schematic view showing a partial cross section of an organic electroluminescence display according to another embodiment of the invention.

While the second embodiment used a light emitting layer with light emitting regions having different colors are disposed in a plane, the light emitting regions can be replaced by white light emitting regions. In FIG. 4, an organic electroluminescence display 41 using white color light emitting layers disposed in a plane is shown.

An organic thin film layer 43 has white light emitting regions 43W disposed in a plane to respectively oppose filter regions 5R, 5G and 5B. The light emitting regions 43W of the organic thin film layer 43 are formed with a laminate of light emitting regions emitting three different colors: red, blue and green, in that order. White light can be obtained by superimposing the three colors by simultaneously emitting light from each of the light emitting regions. The light emitting regions 43W are arranged in a plane. The light emitting regions 43W are then combined with the filter regions 5R, 5G and 5B to form a pixel.

In this embodiment, the white light emitted from each light emitting regions is extracted to the outside with the colors red, blue and green color in accordance with the color transmission property of each filter region 5R, 5G and 5B. Ambient light entering into the transparent substrate is attenuated by transmission through the filter regions 5R, 5G and 5B. Further, the light which has passed through the color filter 5 is reflected with scattering at the reflection electrode and is then transmitted through the filter regions 5R, 5G and 5B to be subjected to further attenuation. This structure further prevents a decrease in contrast due to the reflection of ambient light to provide an electroluminescence display having improved luminance and color purity.

Figure 5:
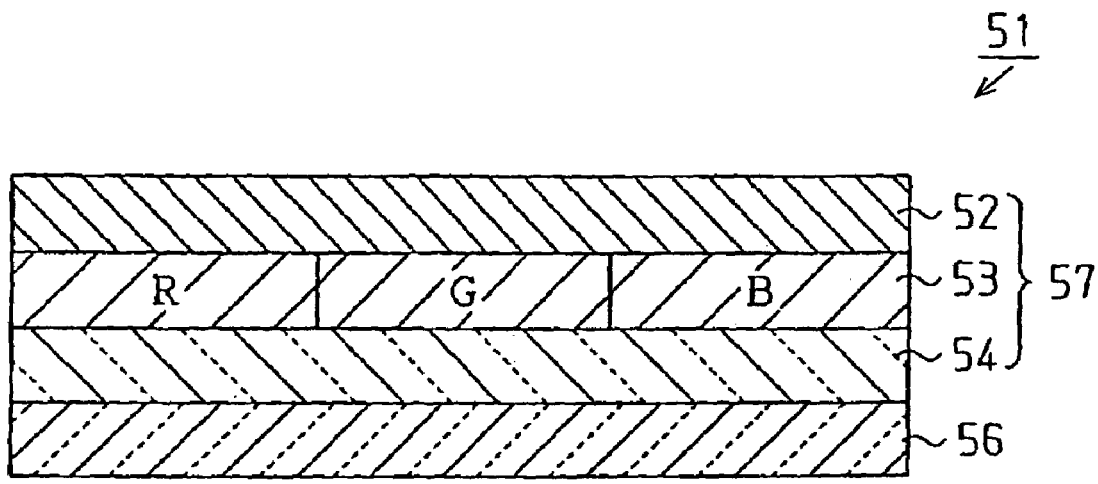
FIG. 5 is a schematic cross sectional view of an electroluminescence display.

Note in this case, the black matrix 32 was shown in FIG. 5 to surround each color filter 5R, 5G and 5B, the black matrix 32 is disposed for improving color purity.

Therefore, the present examples and embodiments are to be considered as illustrative and not restrictive and the invention is not to be limited to the details given herein, but may be modified within the scope and equivalence of the appended claims.

What is claimed is:

1. An organic electroluminescence display comprising:
    a transparent substrate;
    a color filter formed on the transparent substrate, wherein said color filter comprising a plurality of filter regions, each of said plurality of filter regions being transmissible to light of a color different from the color of light transmissible through another filter region;
    a transparent electrode formed on the color filter;
    an organic thin layer comprising a light emitting layer formed on the transparent electrode; and
    a metal electrode formed on the organic thin layer,
    wherein the metal electrode includes a bumpy surface formed with a plurality of irregular bumps and hollows on a surface contacting said organic thin layer for reflection scattering of ambient light which transmitted through the transparent substrate, the color filter, the transparent electrode and the organic thin layer.

2. An organic electroluminescence display according to claim 1 wherein the transparent substrate includes a bumpy surface formed with a plurality of irregular bumps and hollows on a surface that contacts the color filter.

3. An organic electroluminescence display according to claim 2, wherein said plurality of irregular bumps and hollows are formed on a part of the surface contacting the color filter.

4. An organic electroluminescence display according to claim 1, wherein a black matrix is disposed to form a surrounding around each filter region of the color filter.

5. An organic electroluminescence display according to claim 1,
   wherein the light emitting layer includes a plurality of light emitting regions, and each of the light emitting regions emits light of a color that is different from the color of light emitted from another light emitting region, and
   each light emitting region is disposed to respectively oppose a corresponding filter region of the color filter and each filter region of the color filter transmits at least a portion of the light emitted from its opposing light emitting region.

6. An organic electroluminescence display according to claim 1,
   wherein the light emitting layer includes a plurality of white colored light emitting regions, and
   each light emitting region of the light emitting layer is disposed opposing an associated filter region of the filter region.

7. An organic electroluminescence display according to claim 1, the metal electrode is formed in a manner in which a layer thickness at the bump portion is formed with greater thickness in comparison with a layer thickness at the hollow portion.

8. An organic electroluminescence display according to claim 1, wherein the color filter is formed with a plurality of irregular bumps and hollows on a surface contacting said transparent electrode, in which the layer thickness at the hollow portion is formed with greater thickness in comparison with the layer thickness at the bump portion or the layer thickness at the bump portion is formed with greater thickness in comparison with the layer thickness at the hollow portion so that the metal electrode includes a bumpy surface formed with a plurality of irregular bumps and hollows.

9. An organic electroluminescence display according to claim 1, wherein the the transparent electrode is formed with a plurality of irregular bumps and hollows on a surface contacting said organic thin layer, in which the layer thickness at the hollow portion is formed with greater thickness in comparison with the layer thickness at the bump portion or the layer thickness at the bump portion is formed with greater thickness in comparison with the layer thickness at the hollow portion so that the metal electrode includes a bumpy surface formed with a plurality of irregular bumps and hollows.

10. An organic electroluminescence display according to claim 1, wherein the bumpy surface includes bumps whose average height is in a range between 0.2 and 1.5 μm, and average pitch is in a range between 5 and 20 μm.

* * * * *